US011545620B2

(12) United States Patent
Kardasz et al.

(10) Patent No.: US 11,545,620 B2
(45) Date of Patent: Jan. 3, 2023

(54) METHODS OF MANUFACTURE PRECESSIONAL SPIN CURRENT MAGNETIC TUNNEL JUNCTION DEVICES

(71) Applicant: Integrated Silicon Solution, (Cayman) Inc., Grand Cayman (KY)

(72) Inventors: Bartlomiej Kardasz, Fremont, CA (US); Jorge Vasquez, Fremont, CA (US); Mustafa Pinarbasi, Fremont, CA (US)

(73) Assignee: Integrated Silicon Solution, (Cayman) Inc., Grand Cayman (KY)

(*) Notice: Subject to any disclaimer, the term of this patent is extended or adjusted under 35 U.S.C. 154(b) by 51 days.

(21) Appl. No.: 16/996,573

(22) Filed: Aug. 18, 2020

(65) Prior Publication Data

US 2020/0411752 A1 Dec. 31, 2020

Related U.S. Application Data

(62) Division of application No. 15/859,243, filed on Dec. 29, 2017, now Pat. No. 10,784,439.

(51) Int. Cl.
| *H01L 43/08* | (2006.01) |
| *H01L 43/12* | (2006.01) |
| *H01L 43/02* | (2006.01) |
| *H01L 27/22* | (2006.01) |
| *H01L 43/10* | (2006.01) |

(52) U.S. Cl.
CPC .............. *H01L 43/08* (2013.01); *H01L 43/02* (2013.01); *H01L 43/12* (2013.01); *H01L 27/222* (2013.01); *H01L 43/10* (2013.01)

(58) Field of Classification Search
CPC .......... H01L 43/08; H01L 43/12; H01L 43/10
See application file for complete search history.

(56) References Cited

U.S. PATENT DOCUMENTS

| 8,357,982 | B2* | 1/2013 | Kajiyama | ............. H01L 27/228 365/158 |
| 9,537,088 | B1* | 1/2017 | Harms | ..................... H01L 43/08 |
| 2005/0276099 | A1* | 12/2005 | Horng | .................... B82Y 10/00 365/158 |
| 2008/0299679 | A1* | 12/2008 | Zhao | ..................... G11B 5/3909 438/3 |
| 2011/0294291 | A1* | 12/2011 | Matsui | .................. H01L 27/228 257/E21.585 |
| 2012/0280339 | A1* | 11/2012 | Zhang | ...................... G11C 11/16 257/E29.323 |
| 2016/0372656 | A1* | 12/2016 | Pinarbasi | ................ H01L 43/10 |
| 2017/0018705 | A1* | 1/2017 | Harms | .................... H01L 43/10 |
| 2017/0331032 | A1* | 11/2017 | Chen | ....................... H01L 43/10 |

* cited by examiner

*Primary Examiner* — Bilkis Jahan
*Assistant Examiner* — Victor V Barzykin (57) ABSTRACT

A Magnetic Tunnel Junction (MTJ) device can include a second Precessional Spin Current (PSC) magnetic layer of Ruthenium (Ru) having a predetermined thickness and a predetermined smoothness. An etching process for smoothing the PSC magnetic layer can be performed in-situ with various deposition processes after a high temperature annealing of the MTJ formation.

15 Claims, 11 Drawing Sheets

METHODS OF MANUFACTURE PRECESSIONAL SPIN CURRENT MAGNETIC TUNNEL JUNCTION DEVICES

CROSS-REFERENCE TO RELATED APPLICATIONS

This is a divisional of U.S. patent application Ser. No. 15/859,243, filed Dec. 29, 2017, now U.S. Pat. No. 10,784, 439, issued Sep. 22, 2020, which is incorporated herein in its entirety.

BACKGROUND OF THE INVENTION

Computing systems have made significant contributions toward the advancement of modern society and are utilized in a number of applications to achieve advantageous results. Numerous devices, such as desktop personal computers (PCs), laptop PCs, tablet PCs, netbooks, smart phones, game consoles, servers, distributed computing systems, and the like have facilitated increased productivity and reduced costs in communicating and analyzing data in most areas of entertainment, education, business, and science. One common aspect of computing systems is the computing device readable memory. Computing devices may include one or more types of memory, such as volatile random-access memory, non-volatile flash memory, and the like.

Figure 1A:
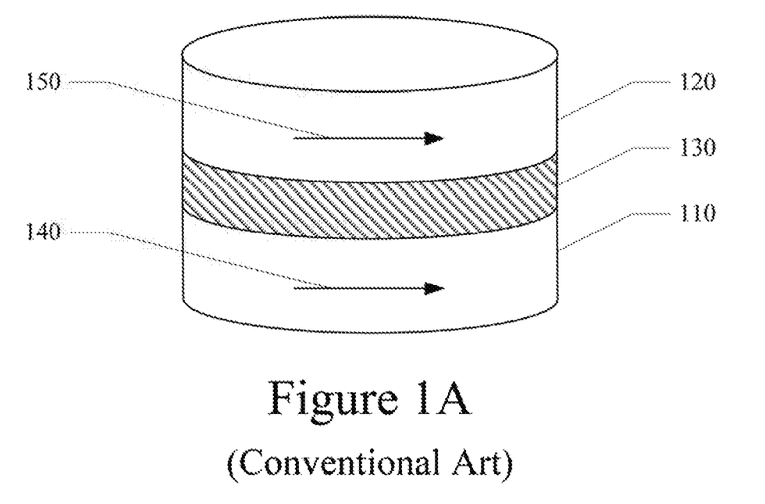
FIGS. 1A and 1B show a simplified diagram of a Magnetic Tunnel Junction (MTJ), in accordance with the convention art.
Figure 1B:
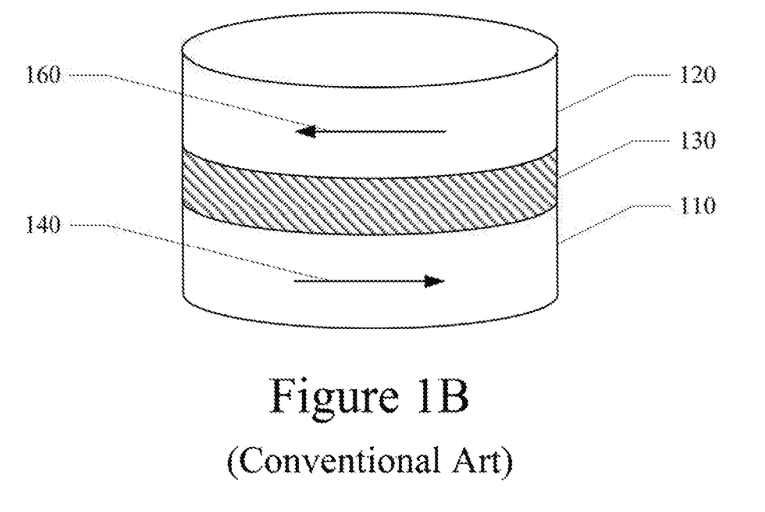

An emerging non-volatile memory technology is Magnetoresistive Random Access Memory (MRAM). In MRAM devices, data can be stored in the magnetization orientation between ferromagnetic layers of a Magnetic Tunnel Junction (MTJ). Referring to FIGS. 1A and 1B, a simplified diagram of a MTJ, in accordance with the convention art, is shown. The MTJ can include two magnetic layers 110, 120, and a magnetic tunnel barrier layer 130. One of the magnetic layers 110 can have a fixed magnetization polarization 140, while the polarization of the magnetization of the other magnetic layer 120 can switch between opposite directions 150, 160. Typically, if the magnetic layers have the same magnetization polarization 140, 150, the MTJ cell will exhibit a relatively low resistance value corresponding to a '1' bit state; while if the magnetization polarization between the two magnetic layers is antiparallel 140, 160 the MTJ cell will exhibit a relatively high resistance value corresponding to a '0' bit state. Because the data is stored in the magnetic fields, MRAM devices are non-volatile memory devices. The state of a MRAM cell can be read by applying a predetermined current through the cell and measuring the resulting voltage, or by applying a predetermined voltage across the cell and measuring the resulting current. The sensed current or voltage is proportional to the resistance of the cell and can be compared to a reference value to determine the state of the cell.

MRAM devices are characterized by densities similar to Dynamic Random-Access Memory (DRAM), power consumption similar to flash memory, and speed similar to Static Random-Access Memory (SRAM). Although MRAM devices exhibit favorable performance characteristics as compared to other memory technologies, there is a continuing need for improved MRAM devices and methods of manufacture thereof.

SUMMARY OF THE INVENTION

The present technology may best be understood by referring to the following description and accompanying drawings that are used to illustrate embodiments of the present technology directed toward Precessional Spin Current (PSC) Magnetic Tunnel Junction (MTJ) devices, improvement to Magnetic Anisotropies in MTJ devices and method of manufacture thereof.

In one embodiment, a PSC MTJ device can include one or more seed layers disposed on a substrate, a Synthetic Antiferromagnetic (SAF) formation disposed on the one or more seed layers, a MTJ formation disposed on the SAF formation, a PSC coupling layer or Perpendicular Magnetic Anisotropy (PMA) enhancement layer disposed on the MTJ formation, a first PSC magnetic layer disposed on the PSC coupling or PMA enhancement layer, and a second PSC magnetic layer disposed on the first PSC magnetic layer. The second PSC magnetic layer can have a thickness of approximately 1.5 nm and a smoothness of approximately 0.2 nm. The PSC MTJ device can further include a third PSC magnetic layer disposed on the second PSC magnetic layer, and a capping layer disposed on the third PSC magnetic layer.

In one embodiment, a method of fabricating the PSC MTJ device can include depositing the second PSC magnetic layer on the first PSC magnetic layer, wherein the second PSC magnetic layer includes Ruthenium (Ru) and the first PSC magnetic layer includes Iron (Fe). The optional intermediate capping layer can be deposited on the second PSC magnetic layer, wherein the intermediate capping layer includes Tantalum (Ta). The first and second PSC magnetic layers, and the optional intermediate capping layer, can be deposited in a first vacuum condition. Optionally, the MTJ formation can be subject to a high temperature annealing process after deposition of the first and second PSC magnetic layers and the optional intermediate capping layer if applicable. The second PSC magnetic layer, and the optional intermediate capping layer if applicable, can be etched by a two-step etching process. At least a portion of the second PSC magnetic layer can be subjected to a slow etch portion of the two-step etching process to smooth the surface of the second PSC magnetic layer. The third PSC magnetic layer can be deposited on the second PSC magnetic layer after the slow etch of the second PSC magnetic layer, wherein the third PSC magnetic layer includes ferromagnetic materials, for instance one or more of Cobalt (Co), Iron (Fe) and Boron (B). The optional capping layer can be deposited on the third magnetic layer. The two-step etching process and the deposition of the third PSC magnetic layer, and optional capping layer if applicable, can be performed in a second vacuum condition.

In another embodiment, a method of fabricating the PSC MTJ device can include receiving a wafer including a first Precessional Spin Current (PSC) magnetic layer disposed on a MTJ formation and a second PSC magnetic layer disposed on the first PSC magnetic. The first PSC magnetic layer can include Iron (Fe) and the second PSC magnetic layer can include Ruthenium (Ru). In a two-step etching process, at least a first portion of the second PSC magnetic layer can be etched with a fast etch process to remove the first portion of the second PSC magnetic layer. At least a second portion of the second PSC magnetic layer can be etched with a slow etch process to smooth the surface of the Ruthenium (Ru) of the second PSC magnetic layer as deposited. A third PSC magnetic layer can be deposited on the second PSC magnetic layer after the slow etch of the second PSC magnetic layer. The third PSC magnetic layer can include one or more of Cobalt (Co), Iron (Fe) and Boron (B). A capping layer can be deposited on the third magnetic layer.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the present technology are illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present technology.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. It is also to be understood that the phraseology and terminology used herein is for the purpose of description and should not be regarded as limiting.

Figure 2:
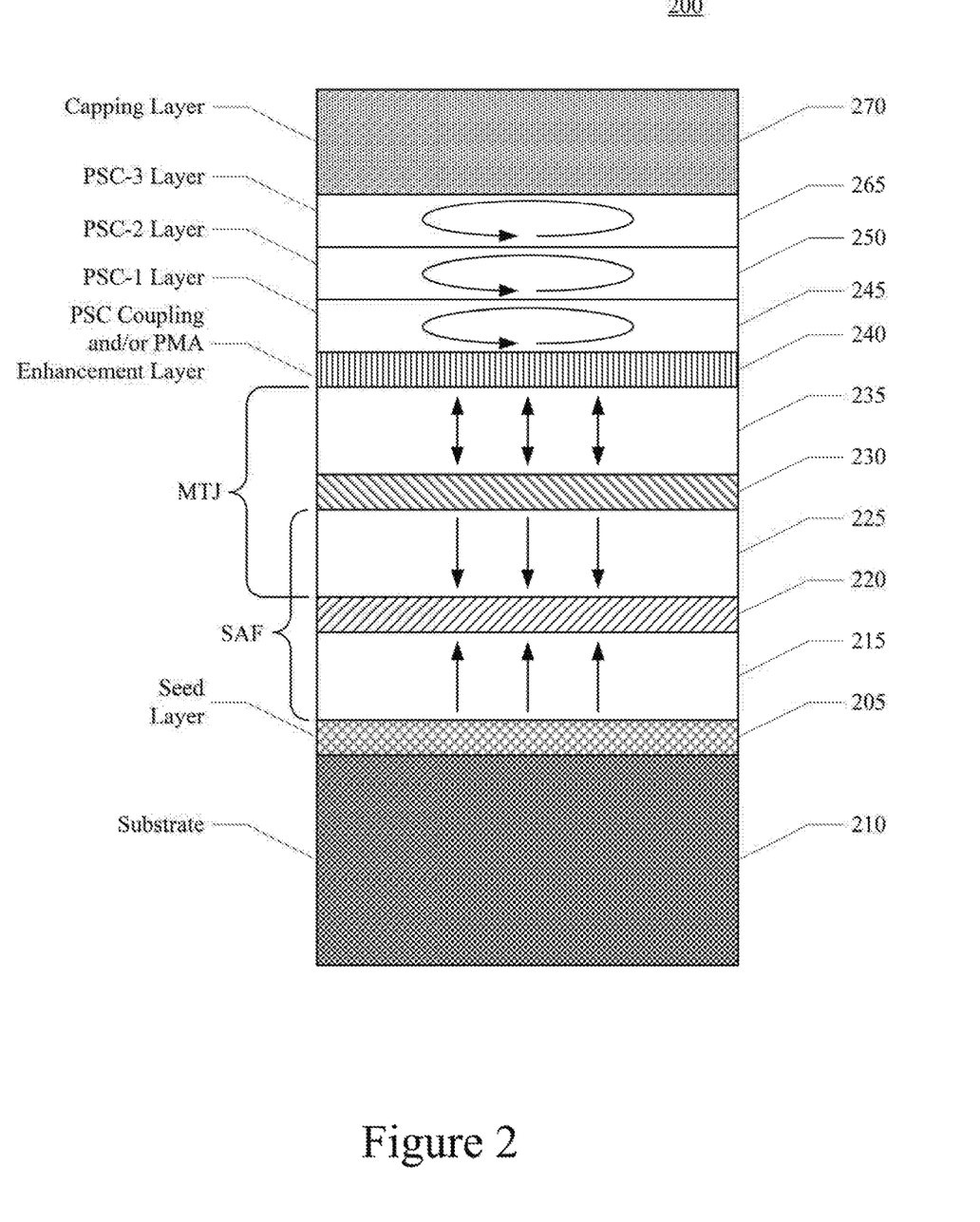
FIG. 2 shows a block diagram of a Precessional Spin Current (PSC) MTJ device, in accordance with embodiments of the present technology.

Referring to FIG. 2, a block diagram of a Precessional Spin Current (PSC) Magnetic Tunnel Junction (MTJ) device, in accordance with embodiments of the present technology, is shown. The PSC MTJ 200 can include one or more seed layers 205 disposed on a substrate 210. The one or more seed layers 205 can be deposited on the substrate 210 to initiate a predetermined crystalline growth in one or more subsequent deposited layers. In one implementation, the one or more seed layers 205 can include one or more layers of Tantalum (Ta), Tantalum Nitride (TaN), Chromium (Cr), Copper (Cu), Copper Nitride (CuN), Nickel (Ni), Iron (Fe), Platinum (Pt), Cobalt (Co) or alloys thereof with a thickness of approximately 1-20 nanometers (nm).

In one aspect, a Synthetic Antiferromagnetic (SAF) formation 215-225 can be disposed on the one or more seed layers 205. In one implementation, the SAF formation 215-225 can include a first ferromagnetic layer 215 disposed on the one or more seed layers 205, a first non-magnetic layer 220 disposed on the first ferromagnetic layer 215, and a second ferromagnetic layer 225 disposed on the first non-magnetic layer 220. The first ferromagnetic layer 215 can be a Cobalt (Co), Cobalt Nickel (CoNi), or Cobalt Platinum (CoPt) alloy with a thickness of approximately 1-5 nm, the first non-magnetic layer 220 can be a Ruthenium (Ru) metal with a thickness of approximately 0.9 nm the second ferromagnetic layer 225 can be a Cobalt (Co), Cobalt Nickel (CoNi), Cobalt Platinum (CoPt) and/or Cobalt-Iron-Boron (Co-Fe-B) alloy with a thickness of approximately 2.3 nm.

In one aspect, a MTJ formation 225-235 can be disposed on the SAF formation 215-225. In one aspect, the MTJ formation 225-235 can share one or more layers in common with the SAF formation 215-225. In one implementation, the MTJ formation 225-235 can include a reference magnetic layer 225, a non-magnetic tunneling barrier layer 230, and a free magnetic layer 235. The reference magnetic layer 225 and the second ferromagnetic layer 225 can be the same layer of Cobalt-Iron-Boron (Co—Fe—B) alloy with a thickness of approximately 1-5 nm. For ease of explanation, where the second ferromagnetic layer 225 and the reference magnetic layer 225 are the same layer, the combined layer will be referred to as the reference magnetic layer 225. The non-magnetic tunneling barrier layer 230 can be a Magnesium (Mg) oxide of approximately 1-10 nm, and the free magnetic layer 235 can be a Cobalt-Iron-Boron (Co—Fe—B) alloy with a thickness of approximately 2.3 nm. The reference magnetic layer 225 can have its magnetization pinned in a predetermined direction, meaning that the reference magnetic layer 225 has a higher coercivity than other layers and a larger magnetic field or spin-polarized current is needed to change the orientation of its magnetization. The magnetization direction of the free magnetic layer 235 can be changed by a smaller magnetic field or sin-polarized current relative to the reference magnetic layer 225.

In one aspect, the magnetization vector of the first ferromagnetic layer 215 and the reference magnetic layer 225 can be substantially perpendicular (e.g., within several degrees) to a plane of the layers (e.g., along a z-axis). The magnetization vector of the free magnetic layer 235 can also be substantially perpendicular to the plane of the layer (e.g., along a z-axis), but its direction can vary by 180 degrees.

In one aspect, a PSC coupling and/or Perpendicular Magnetic Anisotropy (PMA) enhancement layer 240 can be disposed on the MTJ formation 225-235. One or more PSC magnetic layers 245, 250, 265 can be disposed on the PSC coupling and/or PMA enhancement layer 240. In one implementation, the PSC coupling and/or PMA enhancement layer 240 can be a non-magnetic material such as Ruthenium (Ru), Tantalum (Ta), Tantalum Nitride (TaN), Copper (Cu), Copper Nitride (CuN), or Magnesium Oxide (MgO) with a thickness of approximately 1-10 nm. In one embodiment, the one or more PSC magnetic layers 245, 250 can include a first PSC magnetic layer 245 disposed on the PSC coupling and/or PMA enhancement layer 240, a second PSC magnetic layer 250 disposed on the first PSC magnetic layer 245, and a third PSC magnetic layer 265 disposed on the second PSC magnetic layer 250. In one implementation the first PSC magnetic layer 245 can be iron (Fe) with a thickness of approximately 0.6 nm, the second PSC magnetic layer 250 can be ruthenium (Ru) with a thickness of approximately 1.5 nm, and the third PSC magnetic layer 265 can be a cobalt-iron-boron (Co—Fe—B) alloy with a thickness of approximately 1.85 nm.

In one aspect, the one or more PSC magnetic layers 245, 250, 265 have a low coercivity and therefore are typically manufactured using a very soft magnetic material (e.g., less than fifty (50) Oersteds). In one implementation, the one or more PSC magnetic layers 245, 250, 265 have a magnetization vector having a direction substantially parallel to the plane of the layer (e.g., within a plane of the x-y axes), and orthogonal to the magnetization direction of the free magnetic layer 235. In another implementation, the magnetization direction of the one or more PSC magnetic layers 245, 250, 265 can have a horizontal component X and a perpendicular component Z, such that an angle θ between the plane of the free magnetic layer 235 and the magnetic direction of the one or more PSC magnetic layers 245, 250, 265 can be between 0-90 degrees.

In one aspect, a PSC coupling layer 240 can be configured to promote electromagnetic coupling between the one or more PSC magnetic layers 245, 250, 265 and the free magnetic layer 235, such that the magnetic direction of the one or more PSC magnetic layers 245, 250, 265 follow the precession cycle of the free magnetic layer 235. The PSC coupling layer 240 can also be configured to transmit spin current efficiently from the one or more PSC magnetic layers 245, 250, 265 into the free magnetic layer 235. The PSC coupling layer 240 can also be configured to promote good microstructure and high tunneling magnetoresistance (TMR). In one aspect, the one or more PSC magnetic layers 245, 250, 265 are free to rotate near the same frequency as the precessional motion of the free magnetic layer 235. By having nearly the same frequency of magnetization rotations, the free magnetic layer 235 switching time can be significantly reduced and the thermal distribution of the switching times can be tightened. The one or more PSC magnetic layers 245, 250, 265 can also have a rotational frequency greater than zero. The one or more PSC magnetic layers 245, 250, 265 can also have a circular or near circular shape so that its magnetization direction has substantially no shape induced anisotropy in the plane (e.g., the x-y plane). In one aspect, a PMA enhancement layer 240 can be configured to control magnetic anisotropy and free layer magnetization.

Figure 3A:
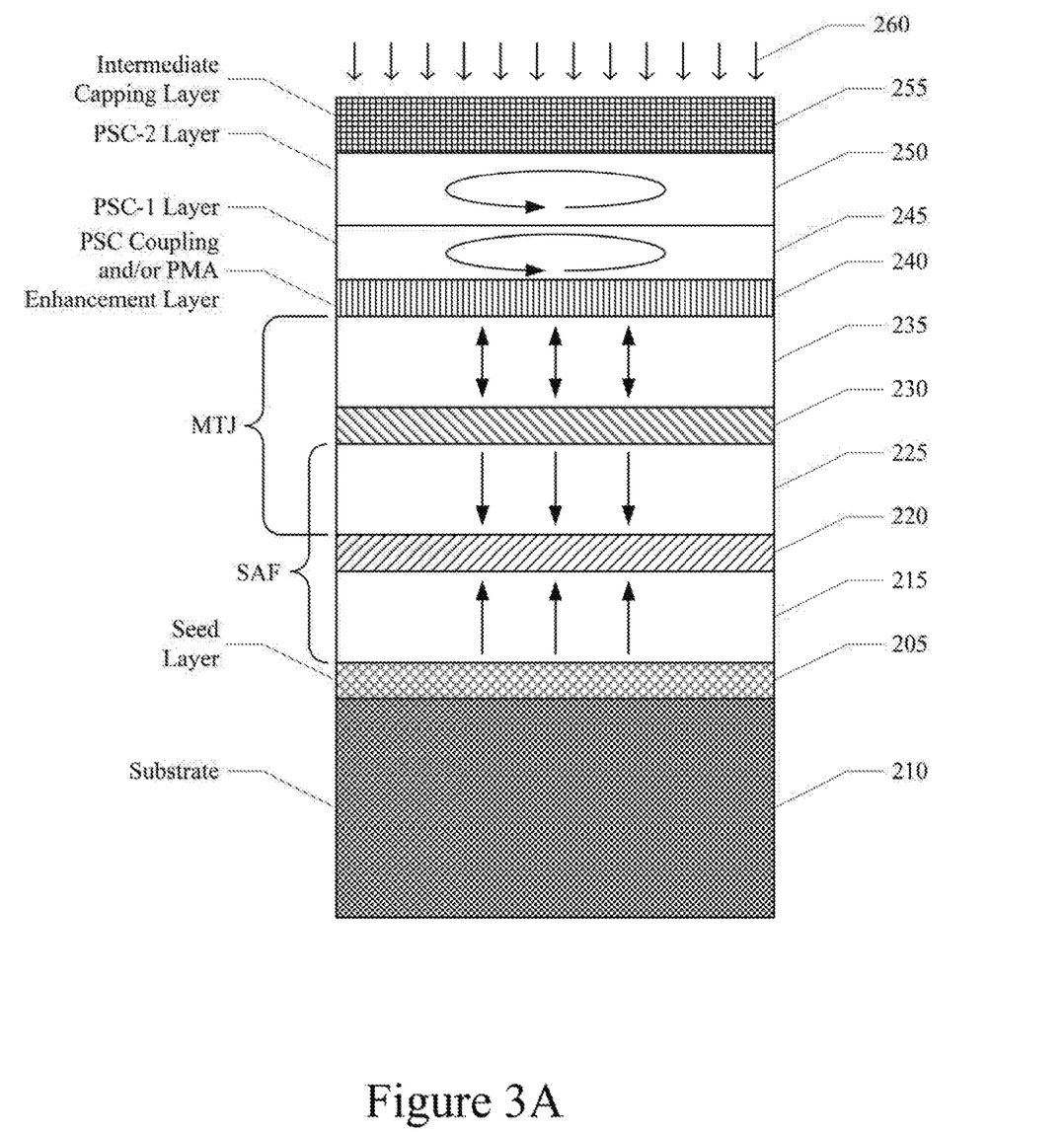
FIGS. 3A-3C show a block diagram illustrating fabrication of one or more PSC layers of a MTJ device, in accordance with embodiments of the present technology.
Figure 3B:
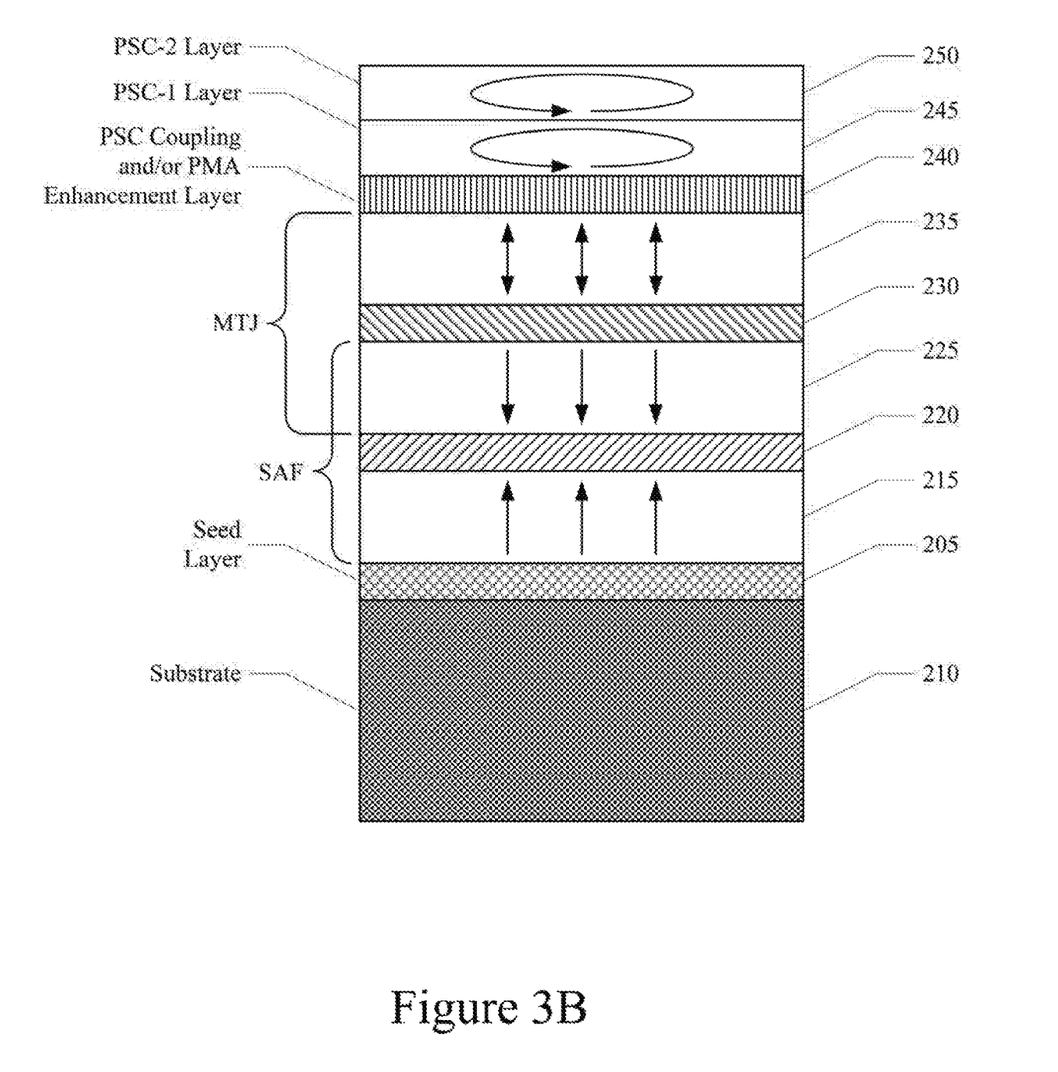
Figure 3C:
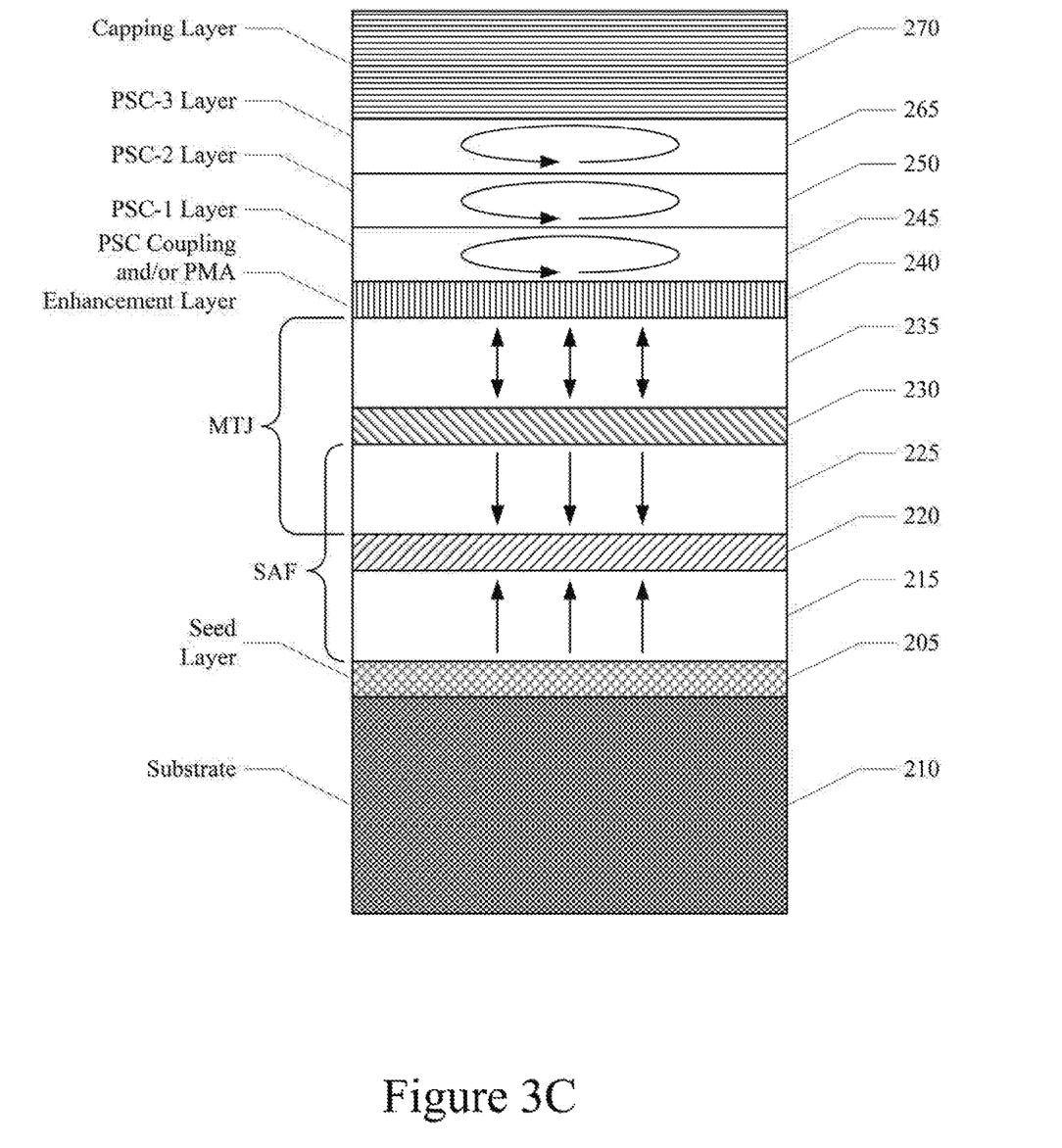

Referring now to FIGS. 3A-3C, a block diagram illustrating fabrication of one or more PSC layers of a Magnetic Tunnel Junction (MTJ), in accordance with embodiments of the present technology, is shown. The processes of forming the seed layer 205 on the substrate 210, the SAF formation 215-225 on the seed layer 205, the MTJ formation 225-235 on the SAF formation 215-225, and the PSC coupling and/or PMA enhancement layer 240 on the MTJ formation 225-235 are well known in the art and are not germane to understanding embodiments of the present technology, and therefore will not be described in further detail herein.

Fabrication of the PSC MTJ after deposition of the PSC coupling and/or PMA enhancement layer 240 can continue with deposition of the first PSC magnetic layer 245. In one aspect, a first PSC magnetic layer 245 of Iron (Fe) can be deposited on the PSC coupling and/or PMA enhancement layer 240. In one implementation, the Iron (Fe) can be deposited using a sputtering, vapor deposition, or similar process. The Iron layer can be deposited to a thickness of approximately 0.6 nm. In one aspect, a second PSC magnetic layer 250 of Ruthenium (Ru) can be deposited on the first PSC magnetic layer 245. In one implementation, the Ruthenium (Ru) can be deposited using a sputtering, vapor deposition, or similar process. The Ruthenium (Ru) can be deposited to a thickness of approximately 2-10 nm. The combination of the PSC coupling and/or PMA enhancement layer 240 and the first and second PSC magnetic layers 245, 250 form an intermediate capping formation. The thickness of the Ruthenium (Ru) can protect the MTJ formation 225-235 from contamination by an ambient environment. In one implementation, the thickness of the Ruthenium (Ru) can protect the MTJ formation 225-235 from oxidation. In one aspect, additional intermediate capping layers 255 can optionally be deposited for additional protection against contamination. In one implementation, an additional intermediate capping layer 255 of Tantalum (Ta) can be deposited on second PSC magnetic layer 250. If the additional intermediate capping layer 255 is used, the thickness of the Ruthenium (Ru) of the second PSC magnetic layer 250 can be reduced to decrease a subsequent etching time. The structure, as fabricated up to this point, can then be exposed to an ambient environment for further processing.

In one aspect, the PSC MTJ can be subject to a two stage-etching process 260 after deposition of the second PSC magnetic layer 250, and after the optional intermediate capping layer 255 if included, as illustrated in Figured FIG. 3A. The two-stage etching process can include a first etch to remove the intermediate capping layer 255 or a portion thereof if included, and optionally a portion of the second PSC magnetic layer 250 at a first rate. A first etch can be performed using Argon (Ar) or Krypton (Kr) plasma etching at the fast rate of approximately 5-20 sec/nanometer and 100-500 Watts power. A second etch can be used to optionally remove another portion of the intermediate capping layer 255 and remove a portion of the PSC magnetic layer 250 at a second slow rate of approximately 60-120 sec/nanometer and 20-100 Watts, as illustrated in FIG. 3B. In one implementation, the second etching process can be performed until the Ruthenium (Ru) of the second PSC coupling layer 250 is thinned to approximate 1-3 nm. The second etching rate can be slower than the first etching rate. In one implementation, the slower second etching rate can smooth the surface of the second PSC magnetic layer 250 as compared to the surface of the PSC magnetic layer 250 as deposited. Smoothing the surface of the second PSC magnetic layer 250 can improve the Precessional Spin Current (PSC) effect by additional control of the coupling mechanism and spin transport enhancement within PSC layers.

In one aspect, a third PSC magnetic layer 265 of Cobalt-Iron-Boron (Co-Fe-B) can be deposited on the second PSC magnetic layer 250 of Ruthenium (Ru) after the two-stage etching process 260. In one implementation, the Cobalt-Iron-Boron (Co-Fe-B) can be deposited using a sputtering, vapor deposition, or similar process. The Cobalt-Iron-Boron (Co-Fe-B) can be deposited to a thickness of approximately 1.85 nm. In one aspect, one or more capping layers 270 can be deposited on the third PSC magnetic layer 265. In one aspect, the two-stage etching process 260, the third PSC magnetic layer 265 deposition, and the one or more capping layer 270 depositions can be performed in-situ without breaking a vacuum of the fabrication equipment used to perform the etching and deposition processes.

In another embodiment, the PSC MTJ fabricated with the Ruthenium (Ru) second PSC magnetic layer 250 and optional intermediate capping layer 255, can be exposed to an ambient environment for transferring to an annealing process. In one aspect, a high temperature annealing process can be configured to enhance performance of the MTJ formation 225-235. In one implementation, a high temperature annealing process can be performed after deposition of the second PSC magnetic layer 250, and the optional intermediate capping layer 255, if used. The second PSC magnetic layer 250, and the optional intermediate capping layer 255 protect the MTJ formation 225-235 from the ambient prior to, during and after annealing. By being able to perform the high temperature annealing after deposition of the second PSC magnetic layer 250, and the optional intermediate capping layer 255, other materials that may be adversely affected by a high-temperature anneal can be utilized in the third PSC magnetic layer 265, and the one or more capping layers 270. In another implementation, the high temperature annealing process can be performed after deposition of the third PSC magnetic layer 265 and the capping layer 270. In one aspect, the two-step etching process 260, the third PSC magnetic layer 265 and the one or more capping layer 270 may not be sensitive to changes due to high temperature annealing. In such case, the high-temperature annealing process utilized for the SAF formation and/or MTJ formation can be performed after the third PSC magnetic layer 265 and the one or more capping layers 270 are deposited. If, however, the materials of the third PSC magnetic layer 265 and/or the one or more capping layer 270 are sensitive to changes due to high temperature annealing, the annealing can be performed after deposition of the second PSC magnetic layer 250 and intermediary capping layer 255.

In one implementation, one or more seed layers 205, the SAF formation 215-225, the MTJ formation 225-235, the optional PSC coupling layer or PMA enhancement layer 240, the first and second PSC magnetic layers 245, 250, and the optional intermediate capping layer 255 can be manufactured by a first entity. Thereafter, the partially fabricated PSC MTJ device can be exposed to an ambient environment for transferring to an annealing process. Fabrication can then proceed with in-situ etching to remove the optional intermediate capping layer 255, smoothing the second PSC magnetic layer 245, and forming the third PSC coupling layer 265 and capping layer 270. In another implementation, the partially fabricated PSC MTJ device can be exposed to an ambient environment for transferring to a second entity. The second entity can thereafter, proceed with in-situ etching to remove the optional intermediate capping layer 255, smoothing the second PSC magnetic layer 245, and forming the third PSC coupling layer 265 and capping layer 270. Furthermore, an annealing process can be performed by either entity after formation of the second PSC magnetic layer 250 and the optional intermediate capping layer 255.

Figure 4:
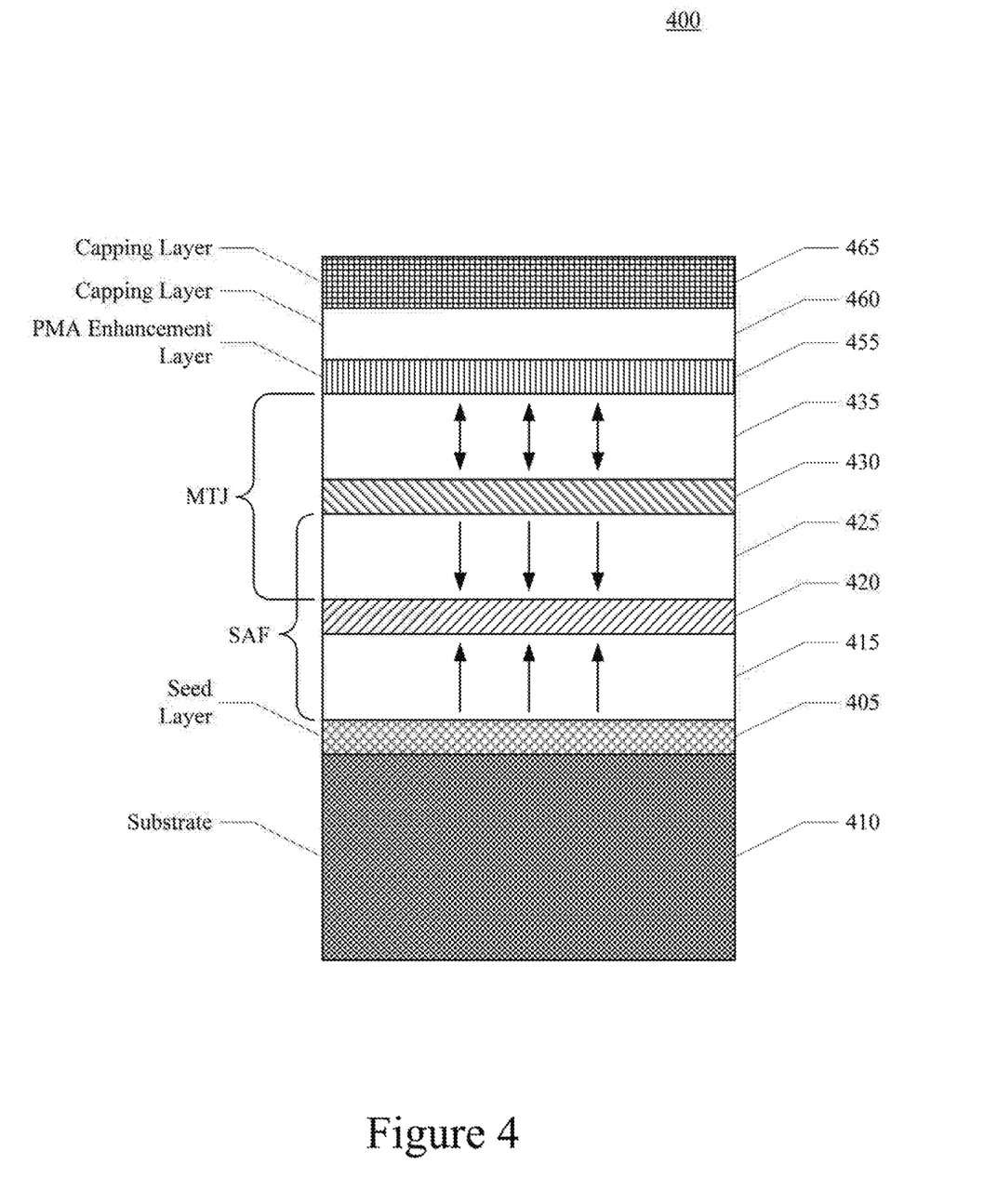
FIG. 4 shows a block diagram of an Interface Perpendicular Magnetic Anisotropies (IMPA) improved MTJ device, in accordance with embodiments of the present technology.

Referring now to FIG. 4, a block diagram of an Interface Perpendicular Magnetic Anisotropies (IPMA) improved MTJ device, in accordance with embodiments of the present technology, is shown. The IMPA improved MTJ 400 can include one or more seed layers 405 disposed on a substrate 410. The one or more seed layers 405 can be deposited on the substrate 410 to initiate a predetermined crystalline growth in one or more subsequent deposited layers. In one implementation, the one or more seed layers 405 can include one or more layers of Tantalum (Ta), Tantalum Nitride (TaN), Chromium (Cr), Copper (Cu), Copper Nitride (CuN), Nickel (Ni), Iron (Fe), or alloys thereof.

In one aspect, a Synthetic Antiferromagnetic (SAF) formation 415-425 can be disposed on the one or more seed layers 405. In one implementation, the SAF formation 415-425 can include a first ferromagnetic layer 415 disposed on the one or more seed layers 405, a first non-magnetic layer 420 disposed on the first ferromagnetic layer 415, and a second ferromagnetic layer 425 disposed on the first non-magnetic layer 420. The first ferromagnetic layer 415 can be a Cobalt (Co), Cobalt Nickel (CoNi), or Cobalt Platinum (CoPt) alloy with a thickness of approximately 1-5 nm, the first non-magnetic layer 420 can be a Ruthenium (Ru) metal with a thickness of approximately 0.90 nm, the second ferromagnetic layer 425 can be a Cobalt (Co), Cobalt Nickel (CoNi), Cobalt Platinum (CoPt) and/or Cobalt-Iron-Boron (Co—Fe—B) alloy with a thickness of approximately 1-5 nm.

In one aspect, a MTJ formation 425-435 can be disposed on the SAF formation 415-425. In one aspect, the MTJ formation 425-435 can share one or more layers in common with the SAF formation 415-425. In one implementation, the MTJ formation 425-435 can include a reference magnetic layer 425, a non-magnetic tunneling barrier layer 430, and a free magnetic layer 435. The reference magnetic layer 425 and the second ferromagnetic layer 425 can be the same layer of Cobalt-Iron-Boron (Co—Fe—B) alloy with a thickness of approximately 2.3 nm. For ease of explanation, where the second ferromagnetic layer 425 and the reference magnetic layer 425 are the same layer, the combined layer will be referred to as the reference magnetic layer 425. The non-magnetic tunneling barrier layer 430 can be a magnesium (Mg) oxide of approximately 1-100 nm, and the free magnetic layer 435 can be a Cobalt-Iron-Boron (Co—Fe—B) alloy with a thickness of approximately 2.3 nm. The reference magnetic layer 425 can have its magnetization pinned in a predetermined direction, meaning that the reference magnetic layer 425 has a higher coercivity than other layers and a larger magnetic field or spin-polarized current is needed to change the orientation of its magnetization. The magnetization direction of the free magnetic layer 435 can be changed by a smaller magnetic field or sin-polarized current relative to the reference magnetic layer 425.

In one aspect, the magnetization vector of the first ferromagnetic layer 415 and the reference magnetic layer 425 can be substantially perpendicular (e.g., within several degrees) to a plane of the layers (e.g., along a z-axis). The magnetization vector of the free magnetic layer 435 can also be substantially perpendicular to the plane of the layer (e.g., along a z-axis), but its direction can vary by 180 degrees.

In one aspect, an IMPA enhancement layer 455 can be disposed on the MTJ formation 425-435. The PMA enhancement layer 240 can be configured to control perpendicular magnetic anisotropy and free layer magnetization. In one aspect, one or more capping layers 460, 465 can be disposed on the IMPA enhancement layer 455. In one implementation, the one or more capping layer 460, 465 can include non-magnetic materials such as ruthenium (Ru) and tantalum (Ta). In one embodiment, the one or more capping layers 460, 465 can include a first capping layer 460 disposed on the IMPA enhancement layer 455, and a second capping layer 465 disposed on the first capping layer 460. In one implementation the first capping layer 455 can be Ruthenium (Ru) with a thickness of approximately 2-3 nm, and the second capping layer 465 can be Tantalum (a) with a thickness of approximately 3 nm.

Figure 5A:
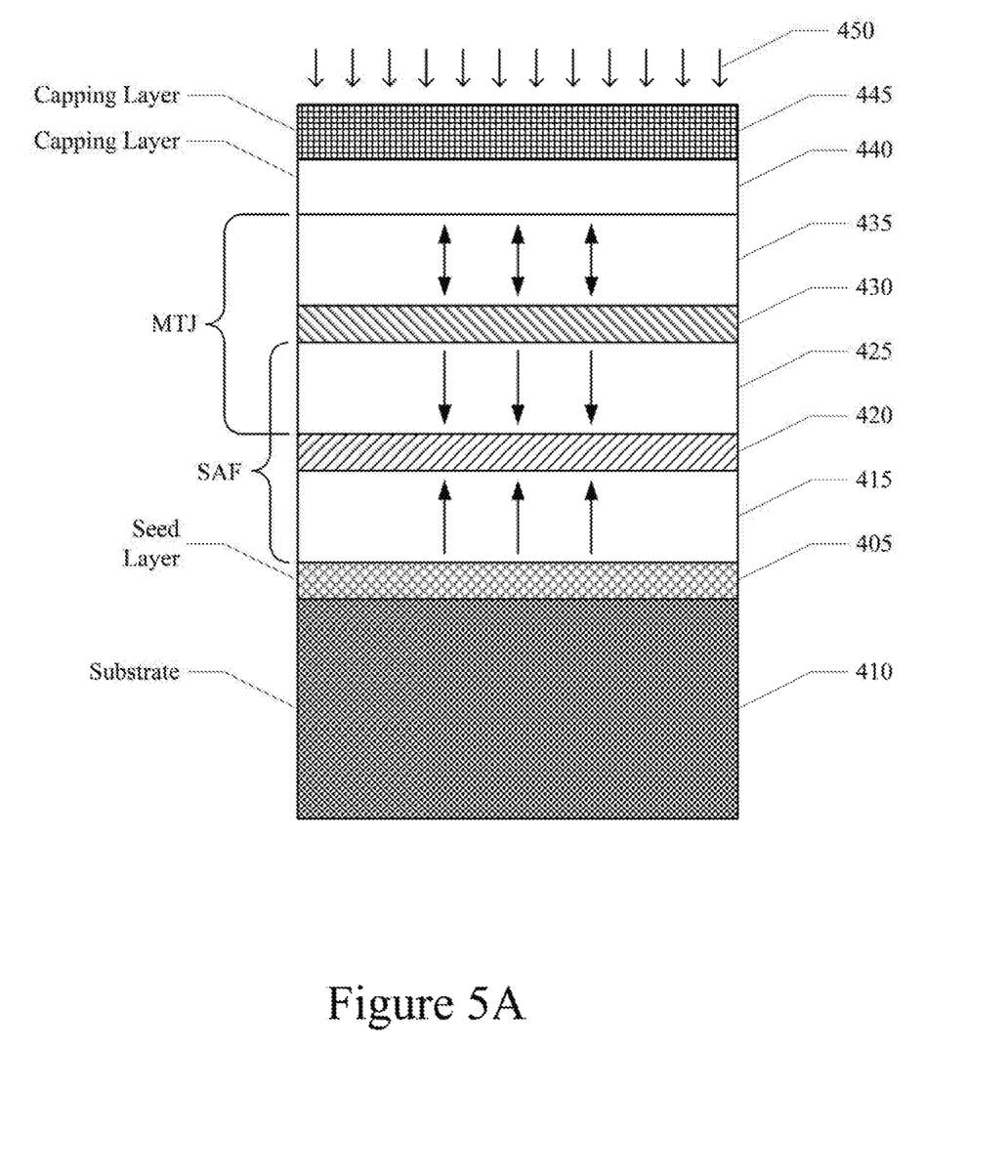
FIGS. 5A-5C show a block diagram illustrating fabrication of an IMPA improved MTJ device, in accordance with embodiments of the present technology.
Figure 5B:
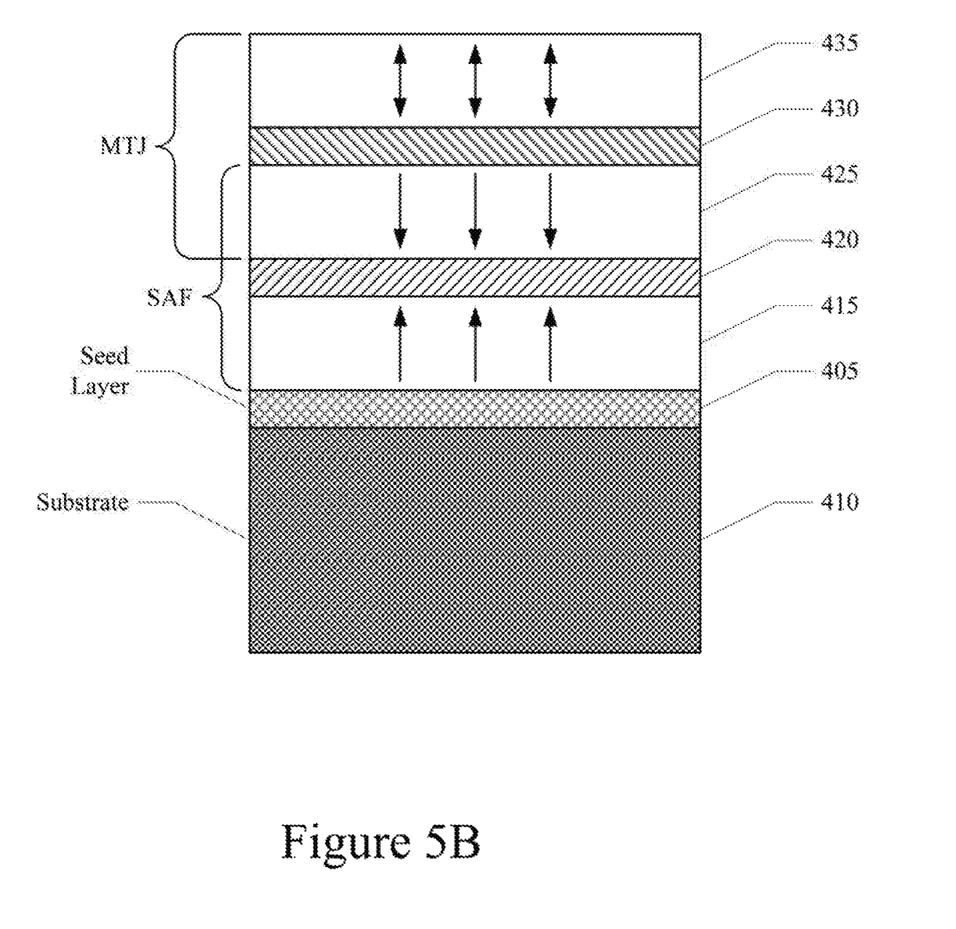
Figure 5C:
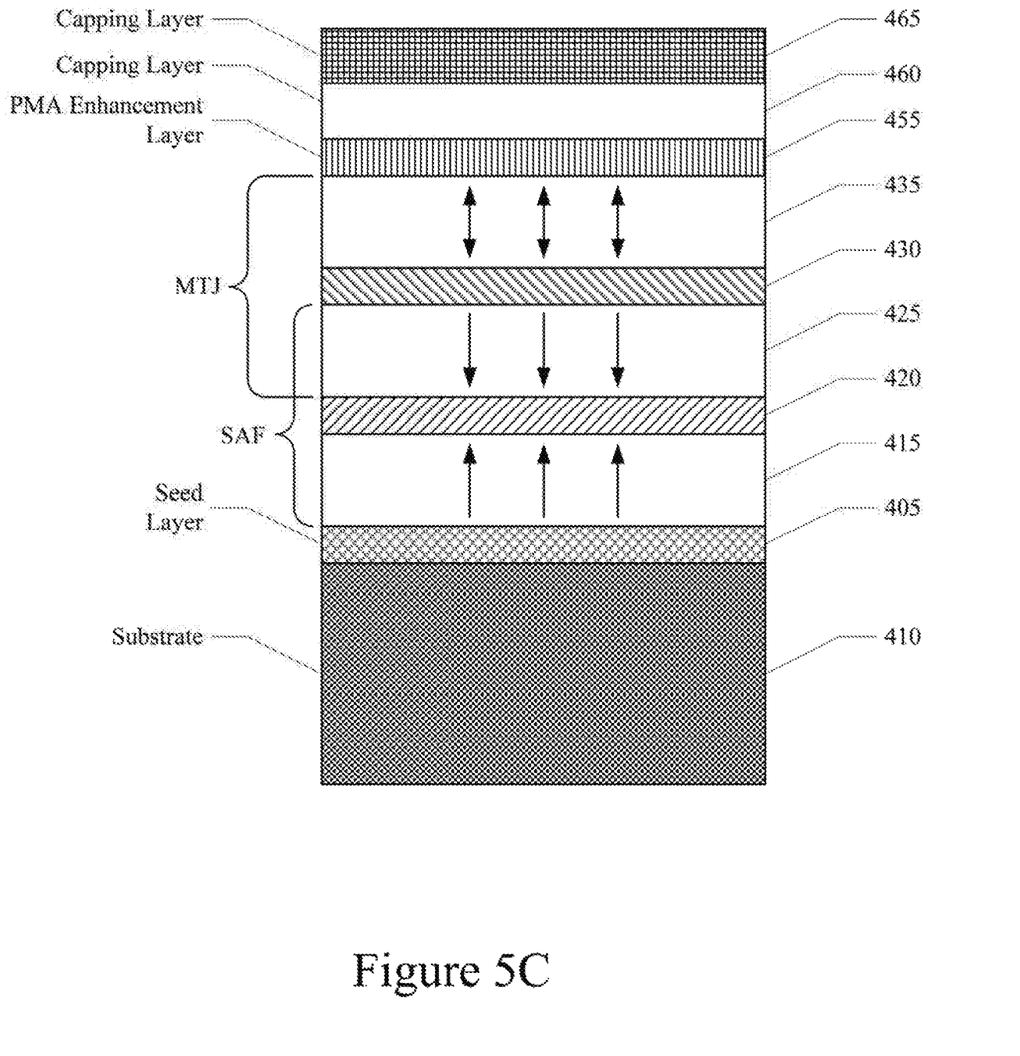

Referring now to FIGS. 5A-5C, a block diagram illustrating fabrication of an IMPA improved MTJ device, in accordance with embodiments of the present technology, is shown. The processes of forming the seed layer 405 on the substrate 410, the SAF formation 415-425 on the seed layer 405, and the MTJ formation 425-435 on the SAF formation 415-425 are well known in the art and are not germane to understanding embodiments of the present technology, and therefore will not be described in further detail herein.

Fabrication of the IMPA improved MTJ after deposition of the MTJ formation 425-435 can continue with deposition of one or more intermediate capping layers 440, 445. In one aspect, a first intermediate capping layer 440 of Ruthenium (Ru) can be deposited on the MTJ formation 425-435, and a second intermediate capping layer 445 of Tantalum (Ta) can be deposited on the first intermediate capping layer 440. In one implementation, the Ruthenium (Ru) can be deposited using a sputtering, vapor deposition, or similar process. The Ruthenium (Ru) can be deposited to a thickness of approximately 2-5 nm. The Tantalum (Ta) can be deposited using a sputtering, vapor deposition, or similar process. The Tantalum (Ta) can be deposited to a thickness of approximately 3 nm.

In one aspect, the IPMA improved MTJ can be subject to a two-stage etching process 450 after deposition of the one or more intermediate capping layers 440, 445. The two-stage etching process 450 can include a first etch used to remove at least a portion of the one or more intermediate capping layers 440, 445. A second etch can be used to optionally remove another portion of the one or more intermediate capping layer 440, 445 and optionally remove a portion of the free magnetic layer 435 at a second rate. In one implementation, the etching process is performed until the Ruthenium (Ru) of the first intermediate capping layer 440 is substantially removed. The second etching rate can be slower than the first etching rate and used to remove any remaining Ruthenium (Ru) of the first intermediate capping layer 440. In one implementation, the slower second etching rate can also smooth the surface of the free magnetic layer 435 as compared to the surface of the free magnetic layer 435 as deposited. Smoothing the surface of the free magnetic layer 435 can improve Interface Perpendicular Magnetic Anisotropies (IPMA) of the free magnetic layer 435. The two-stage etching process 450 also allows for deposition of additional enhancement layers on top of the free magnetic layer 435 to control perpendicular anisotropy and free layer magnetization.

In one aspect, a PMA enhancement layer 455 includes one or more of Cobalt (Co), Iron (Fe), Boron (B) and/or Tantalum Nitride (TaN) can be deposited on the free magnetic layer 435 after the two-stage etching process 450. In one implementation, the Tantalum Nitride (TaN) can be deposited using a sputtering, vapor deposition, or similar process. The Tantalum Nitride (TaN) can be deposited to a thickness of approximately 2.0 nm. In one aspect, one or more capping layers 460, 465 can be deposited on the IPMA enhancement layer 455. In one instance, a first capping layer of Ruthenium (Ru) can be deposited on the MTJ formation 425-535, and a second capping layer 465 of Tantalum (Ta) can be deposited on the first capping layer 460. In one implementation, the Ruthenium (Ru) can be deposited using a sputtering, vapor deposition, or similar process. The Ruthenium (Ru) can be deposited to a thickness of approximately 2-5 nm. The Tantalum (Ta) can be deposited using a sputtering, vapor deposition, or similar process. The Tantalum (Ta) can be deposited to a thickness of approximately 3 nm.

In one aspect, the two-stage etching process 450, the IPMA enhancement layer 455 deposition, and the one or more capping layer 460, 465 depositions can be performed in-situ without breaking a vacuum of the fabrication equipment used to perform the etching and deposition processes. In aspect, the IPMA improved MTJ fabricated with the one or more intermediate capping layers 440, 445 can be exposed to an ambient environment for transferring to an annealing process. In one aspect, a high temperature annealing process can be configured to enhance performance of the MTJ formation 425-435. In one implementation, a high temperature annealing process can be performed after deposition of the one or more intermediate capping layers 440, 445. The one or more intermediate capping layers 440, 445 can protect the MTJ formation 425-435 from the ambient prior to, during and after annealing. By being able to perform the high temperature annealing after deposition of the one or more intermediate capping layers 440, 445, other materials that may be adversely affected by a high-temperature anneal can be utilized in the PMA enhancement layer 455, and the one or more capping layers 460, 465. In another implementation, the high temperature annealing process can be performed after deposition of the IPMA enhancement layer 455 and the one or more capping layer 460, 465. In one aspect, the two-step etching process 450, the PMA enhancement layer 455 and the one or more capping layer 460, 465 may not be sensitive to changes due to high temperature annealing. In such case, the high-temperature annealing process utilized for the SAF formation 415-425 and/or MTJ formation 425-435 can be performed after the PMA enhancement layer 455 and the one or more capping layers 460, 465 are deposited. If, however, the materials of the PMA enhancement layer 455 and/or the one or more capping layer 460, 465 are sensitive to changes due to high temperature annealing, the annealing can be performed after deposition of the one or more intermediary capping layers 440, 445.

In one implementation, the one or more seed layers 405, the SAF formation 415-425, the MTJ formation 425-435, and the first and second intermediate capping layers 440, 445 can be manufactured by a first entity. Thereafter, the partially fabricated IMPA improved MTJ device can be exposed to an ambient environment for transferring to an annealing process. Fabrication can then proceed with in-situ etching to remove the first and second intermediate capping layers 440, 445, smoothing the free magnetic layer 435, and forming the optional PMA enhancement layer 455, and forming the first and second capping layers 460, 465. In another implementation, the partially fabricated IMPA improved MTJ device can be exposed to an ambient environment for transferring to a second entity. The second entity can thereafter, proceed with in-situ etching to remove the first and second intermediate capping layers 440, 445, smoothing the free magnetic layer 435, and forming the optional PMA enhancement layer 455 and first and second capping layers 460, 465. Furthermore, an annealing process can be performed by either entity after formation of the first and second intermediate capping layers 440, 445.

Figure 6:
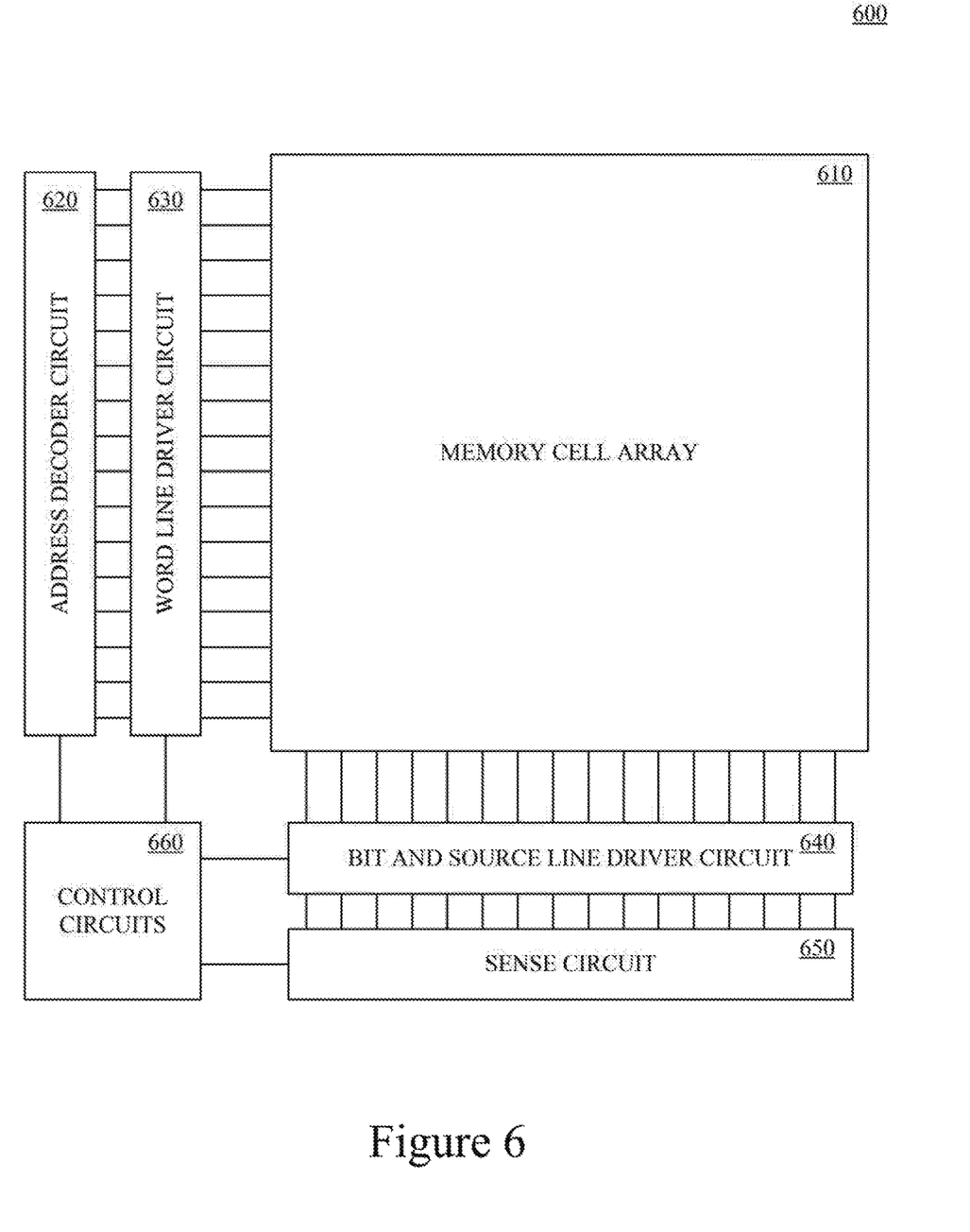
FIG. 6 shows a block diagram of a Magnetoresistive Random Access Memory (MRAM), in accordance with embodiments of the present technology.

Referring now to FIG. 6, a block diagram of a Magnetoresistive Random Access Memory (MRAM), in accordance with embodiments of the present technology, is shown. The MRAM 600 can include a memory cell array 610, an address decoder circuit 620, a word line driver circuit 630, a bit line and source line driver circuit 640, a sense circuit 650, and control circuit 660. The MRAM 600 can include other well-known circuits that are not necessary for an understanding of the present technology and therefore are not discussed herein.

The memory cell array 610 can include a plurality of memory cells organized in rows and columns, with sets of word lines, source lines and bit lines spanning the array of cells throughout the chip. In one embodiment, the memory cells can be PSC MTJ cells as described above with reference to FIGS. 2 and 3A-3C. In another embodiment, the memory cells can be IPMA improved MTJ cells as described above with reference to FIGS. 4 and 5A-5C. The address decoder 620 can map a given memory address to a particular row of MTJ memory cells in the array. The output of the address decoder 620 can be input to the word line driver 630. The output of the word line driver 630 can drive the word lines to select a given word line of the array. The bit line and source line driver 640 and the sense circuit 650 utilize the source lines and bit lines of the array to read from and write to memory cells of a selected word line of the array.

In one aspect, the control circuit 660 can be configured to cause the bit line and source line driver circuit 640 to apply appropriate write voltages to bit lines, source lines and word lines to write data to cells in a selected word. The magnetic polarity, and corresponding logic state, of the free layer of the MTJ can be changed to one of two states depending upon the direction of current flowing through the MTJ. For read operations, the control circuit 660 can be configured to cause the bit line and source line driver circuit 640 to apply appropriate read voltages to the bit lines, sources lines and word lines to cause a current to flow in the source lines that can be sensed by the sense circuit 650 to read data from cells in a selected word.

Figure 7:
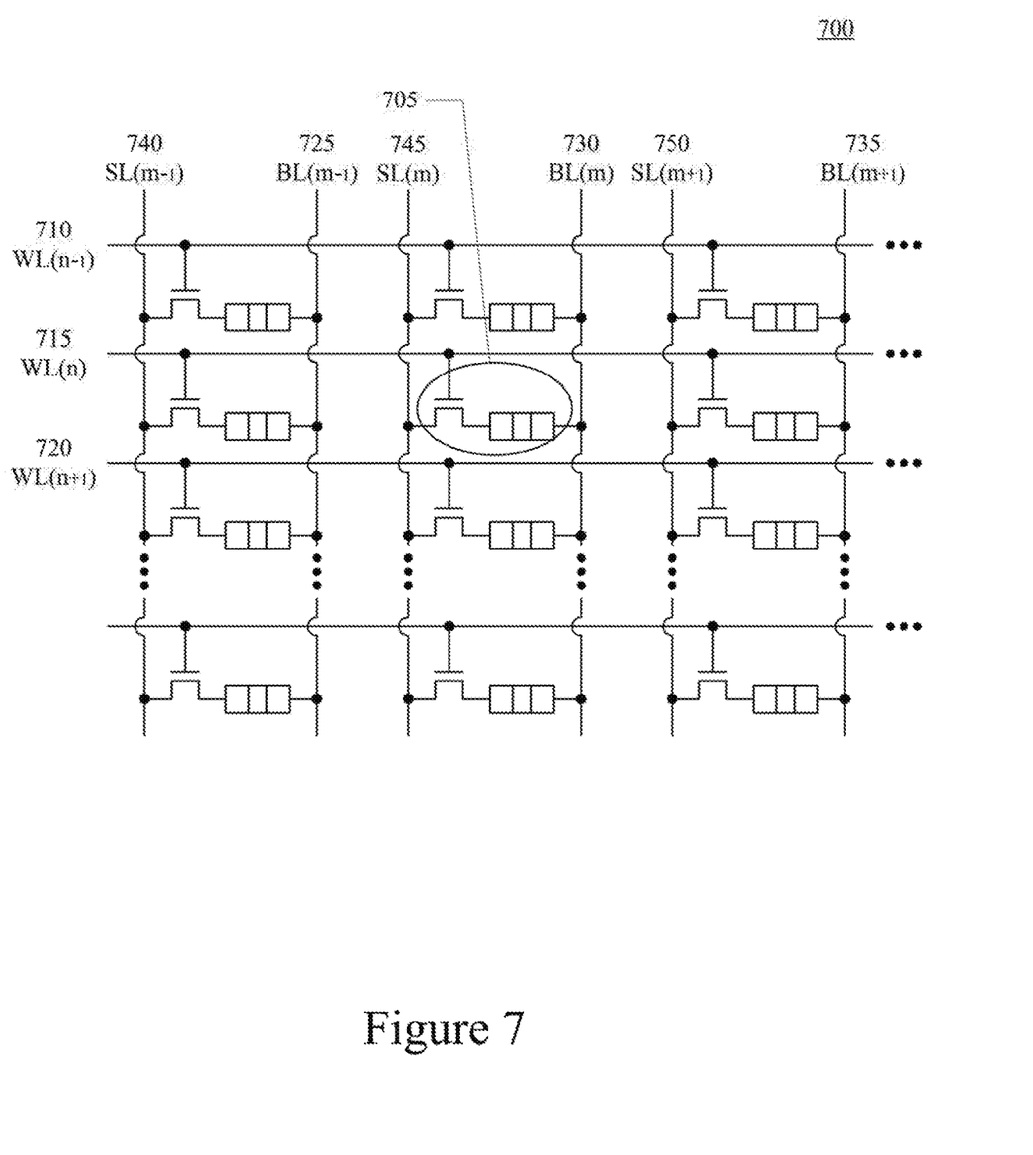
FIG. 7 shows a circuit diagram of a MRAM memory cell array, in accordance with the conventional art.

Referring now to FIG. 7, a circuit diagram of a MRAM memory cell array, in accordance with the conventional art, is shown. Again, the memory cell array 700 can include a plurality of MTJ memory cells 705, a plurality of word lines 710-720, a plurality of bit lines 725-735 and a plurality of source lines 740-750. The word lines 710-720 of the memory cell array 700 can be organized along columns of the array. The bit lines 725-735 and source lines 740-750 can be organized along rows of the array. Each memory cell 705 can comprise a MTJ cell and an access transistor. The gates of the access transistors arranged along columns of the array can be coupled to respective word lines 710-720. The sources of the access transistors arranged along rows of the array can be coupled to respective source lines 740-750. The free magnetic layer of the MTJ cells arranged along rows of the array can be coupled to a respective bit line 725-735.

In one example, to read data from a given MTJ cell 705, the respective bit line BL(m) 730 can be biased at a bit line read potential (e.g., $V_{BLR}$) and the respective source line SL(m) 745 can be biased at ground (e.g., 0). When the respective word line WL(n) 715 is biased at a word line read voltage potential (e.g., $V_{WLR}$) a current proportional to the resistance of the MTJ of the cell 705 will flow from the respective bit line BL(m) 730 to the respective source line SL(m) 745. In such case, the current sensed on the respective bit line BL(m) 730 can indicate the state of the selected cell 705.

To write a logic '0' state to the given memory cell 705, the respective bit line BL(m) 730 can be biased at a bit line write potential (e.g., $V_{BLW}$) and the respective source line SL(m) 745 can be biased at ground (e.g., 0). When the respective word line WL(n) 715 is biased at a word line write potential (e.g., $V_{WLW}$) a resulting current flowing through the MTJ of the cell 705 in a first direction will cause the free magnetic layer into a state corresponding to a logic '0' state. To write a logic '1' state to the given memory cell 705, the respective bit line BL(m) 730 can be biased at ground (e.g., 0) and the respective source line SL(m) 745 can be biased at a source line write potential (e.g., $V_{SLW}$). When the respective word line WL(n) 715 is biased at a word line write potential (e.g., $V_{WLW}$) a resulting current flowing through the MTJ of the cell 705 in a second direction will cause the free magnetic layer into a state corresponding to a logic '1' state.

In another example, to read data from a given memory cell 705, the respective bit line BL(m) 730 can be biased at ground (e.g., 0) and the respective source line SL(m) 745 can be biased at a bit line read potential (e.g., $V_{BLR}$). When the respective word line WL(n) 715 is biased at a word line read potential (e.g., $V_{WRL}$) a current proportional to the resistance of the MTJ of the given cell 705 will flow. In such case, the current sensed on the respective source line SL(m) 745 can indicate the state of the selected cell 705.

To write a logic '0' state to the given memory cell 705, the respective bit line BL(m) 730 can be biased at a bit line write potential (e.g., $V_{BLW}$) and the respective source line SL(m) 745 can be biased at ground (e.g., 0). When the respective word line WL(n) 715 is biased at a word line write potential (e.g., $V_{WLW}$) a resulting current flowing through the MTJ of the cell 705 in a first direction will cause the free magnetic layer into a logic '0' state. To write a logic '1' state to a given memory cell 705, the respective bit line BL(m) 730 can be biased at ground (e.g., 0) and the respective source line SL(m) 745 can be biased at a source line write potential (e.g., $V_{SLW}$). When the respective word line WL(n) 715 is biased at a word line write state (e.g., $V_{WLW}$) a resulting current flowing through the MTJ of the cell 705 in a second direction will cause the free magnetic layer into a logic '1' state.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A Magnetic Tunnel Junction (MTJ) device comprising:
a Synthetic Antiferromagnetic (SAF) formation disposed on a substrate;
a MTJ formation disposed on the SAF formation;
a first Precessional Spin Current (PSC) magnetic layer disposed on the MTJ formation, wherein the first PSC magnetic layer includes Iron (Fe) and has a thickness of approximately 0.4-1 nanometers (nm);
a second PSC magnetic layer disposed on the first PSC magnetic layer, wherein the second PSC magnetic layer includes Ruthenium (Ru) and has a thickness of approximately 0.5-3 nm and a smoothness of approximately 0.2 nm; and
a third PSC magnetic layer disposed on the second PSC magnetic layer, wherein the third PSC magnetic layer includes one or more of Cobalt (Co), Iron (Fe) and Boron (B) and has a thickness of approximately 1-5 nm.

2. The MTJ device of claim 1, wherein the MTJ formation comprises:
a reference magnetic layer disposed on the SAF formation, wherein the reference magnetic layer includes one or more of Cobalt (Co), Iron (Fe) and Boron (B), Cobalt Nickel (CoNi), Cobalt Platinum (CoPt) and has a thickness of approximately 1-5 nm;
a non-magnetic tunneling barrier layer disposed on the reference magnetic layer, wherein the non-magnetic tunneling barrier layer includes Magnesium (Mg) oxide and has a thickness of approximately 1-10 nm; and
a free magnetic layer disposed on the non-magnetic tunneling barrier layer, wherein the free magnetic layer includes one or more of Cobalt (Co), Iron (Fe) and Boron (B) and has a thickness of approximately 1-3 nm.

3. The MTJ device of claim 1, wherein the SAF formation comprises:
a first ferromagnetic layer disposed on the substrate, wherein the first ferromagnetic layer includes one or more of Cobalt (Co), Cobalt Nickel (CoNi) and Cobalt Platinum (CoPt)) and has a thickness of approximately 1-5 nm; and
a first non-magnetic layer disposed on the first ferromagnetic layer, wherein the first non-magnetic layer includes Ruthenium (Ru) and has a thickness of approximately 0.9 nm.

4. The MTJ device of claim 1, further comprising:
a PSC coupling layer disposed between the MTJ formation and the first PSC magnetic layer, wherein the PSC coupling layer includes one or more of Ruthenium (Ru), Tantalum (Ta), Copper (Cu), Copper Nitride (CuN), and Magnesium oxide (MgO) and has a thickness of approximately 1-20 nm.

5. The MTJ device of claim 1, further comprising:
a Perpendicular Magnetic Anisotropy (PMA) enhancement layer disposed between the MTJ formation and the first PSC magnetic layer, wherein the PMA enhancement layer includes one or more of Cobalt (Co), Iron (Fe), Boron (B) and Tantalum Nitride (TaN) and has a thickness of approximately 0.5-2 nm.

6. The MTJ device of claim 1, further comprising:
one or more capping layers disposed on the third PSC magnetic layer.

7. The MTJ device of claim 1, further comprising:
one or more seed layers disposed between the substrate and the SAF formation.

8. The MTJ device of claim 1, wherein the MTJ device comprises a Magnetoresistive Random Access Memory (MRAM).

9. A Magnetic Tunnel Junction (MTJ) device comprising:
a reference magnetic layer;
a non-magnetic tunneling barrier layer disposed on the reference magnetic layer;
a free magnetic layer disposed on the non-magnetic tunneling barrier layer;
a first Precessional Spin Current (PSC) magnetic layer disposed on the free magnetic layer;
a second PSC magnetic layer disposed on the first PSC magnetic layer, wherein the second PSC magnetic layer includes Ruthenium (Ru) and has a thickness of approximately 0.5-3 nm and a smoothness of approximately 0.2 nm; and
a third PSC magnetic layer disposed on the second PSC magnetic layer, wherein the third PSC magnetic layer includes one or more of Cobalt (Co), Iron (Fe) and Boron (B) and has a thickness of approximately 1-5 nm.

10. The MTJ device of claim 9, further comprising:
a PSC coupling layer disposed between the free magnetic layer and the first PSC magnetic layer, wherein the PSC coupling layer includes one or more of Ruthenium (Ru), Tantalum (Ta), Copper (Cu), Copper Nitride (CuN), and Magnesium oxide (MgO) and has a thickness of approximately 1-20 nm.

11. The MTJ device of claim 10, further comprising:
one or more capping layers disposed on the third PSC magnetic layer.

12. The MTJ device of claim 11, wherein:
the reference magnetic layer includes one or more of Cobalt (Co), Iron (Fe) and Boron (B), Cobalt Nickel (CoNi), Cobalt Platinum (CoPt) and has a thickness of approximately 1-5 nm;
the non-magnetic tunneling barrier layer includes Magnesium (Mg) oxide and has a thickness of approximately 1-10 nm; and
the free magnetic layer includes one or more of Cobalt (Co), Iron (Fe) and Boron (B) and has a thickness of approximately 1-3 nm.

13. The MTJ device of claim 9, further comprising:
a Perpendicular Magnetic Anisotropy (PMA) enhancement layer disposed between the free magnetic layer and the first PSC magnetic layer, wherein the PMA enhancement layer includes one or more of Cobalt (Co), Iron (Fe), Boron (B) and Tantalum Nitride (TaN) and has a thickness of approximately 0.5-2 nm.

14. The MTJ device of claim 13, further comprising:
one or more capping layers disposed on the third PSC magnetic layer.

15. The MTJ device of claim 14, wherein:
the reference magnetic layer includes one or more of Cobalt (Co), Iron (Fe) and Boron (B), Cobalt Nickel (CoNi), Cobalt Platinum (CoPt) and has a thickness of approximately 1-5 nm;

the non-magnetic tunneling barrier layer includes Magnesium (Mg) oxide and has a thickness of approximately 1-10 nm; and the free magnetic layer includes one or more of Cobalt (Co), Iron (Fe) and Boron (B) and has a thickness of approximately 1-3 nm.

* * * * *